April 14, 1970 W. E. SHOEMAKER 3,506,926
DIRECT COUPLED DIFFERENTIAL TRANSISTOR AMPLIFIER WITH IMPROVED OFFSET VOLTAGE TEMPERATURE COEFFICIENT AND METHOD OF COMPENSATION
Filed Oct. 18, 1965
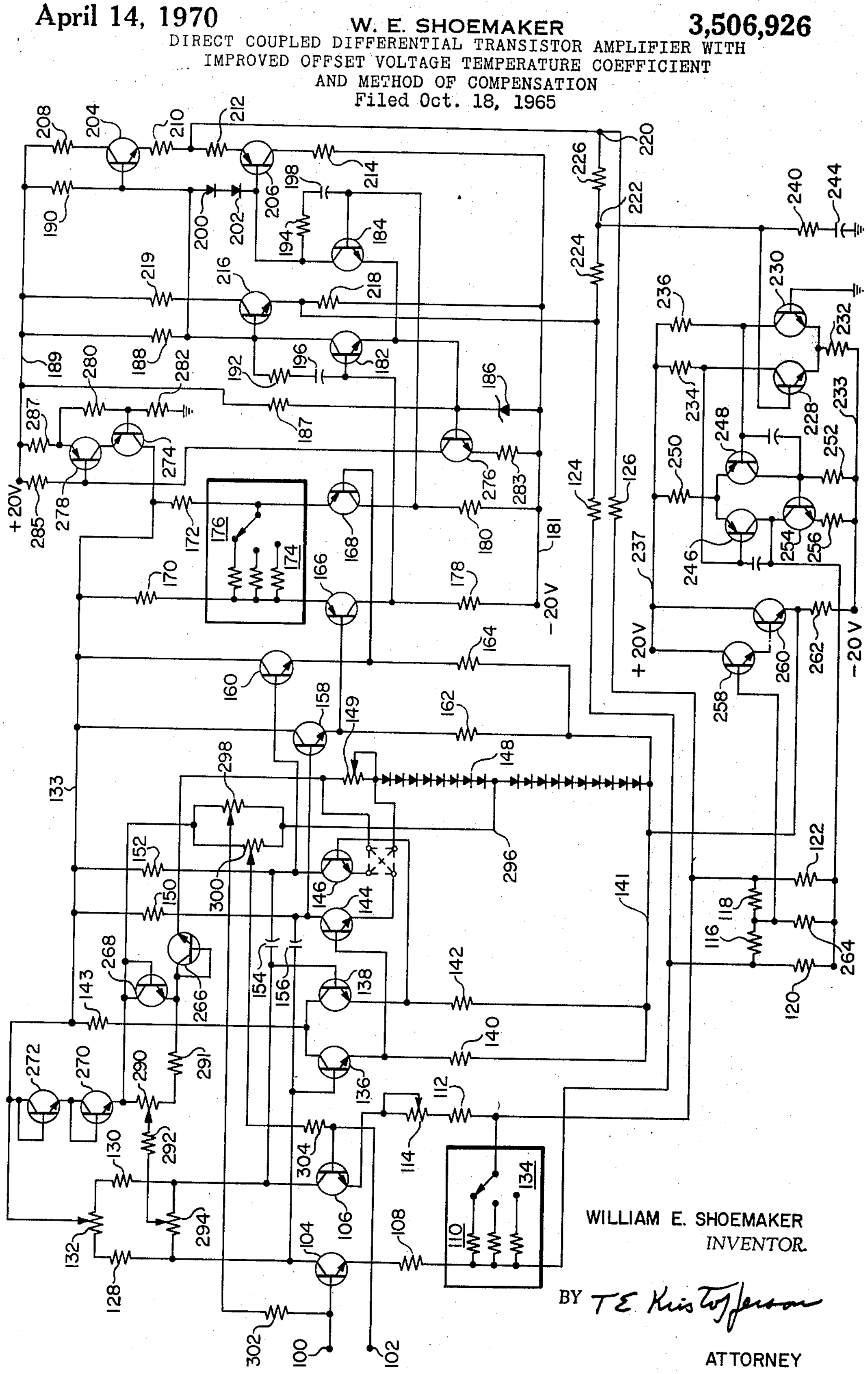
WILLIAM E. SHOEMAKER
*INVENTOR.*
BY T.E. Kristofferson
ATTORNEY United States Patent Office 3,506,926
Patented Apr. 14, 1970

3,506,926

DIRECT COUPLED DIFFERENTIAL TRANSISTOR AMPLIFIER WITH IMPROVED OFFSET VOLTAGE TEMPERATURE COEFFICIENT AND METHOD OF COMPENSATION

William F. Shoemaker, Fullerton, Calif., assignor to Beckman Instruments, Inc., a corporation of California Filed Oct. 18, 1965, Ser. No. 496,791
Int. Cl. H03f 3/68
U.S. Cl. 330—30 8 Claims

ABSTRACT OF THE DISCLOSURE

A direct coupled differential transistor amplifier having a voltage point which varies linearly with temperature at a different rate than the first stage transistor collector electrodes wherein the voltage point is connected to the collector electrodes by a resistive network to imbalance the collector currents to compensate for any differential input offset voltage variance with temperature change.

This invention relates to a direct coupled differential transistor amplifier having an improved offset voltage temperature coefficient and, more particularly, to such an amplifier provided with means and a method for obtaining zero input offset voltage by imbalancing currents in the collector circuits of one stage by an amount proportional to temperature to compensate for any differential change caused by temperature.

Several attempts have been made in the prior art to provide a low-cost, direct coupled differential transistor amplifier which has a temperature performance comparable to chopper stabilized amplifiers and avoids the disadvantages associated with the use of a chopper or modulator, for such applications as amplifier-per-channel data acquisition. Such an amplifier must have low offset voltage, low input or ejected current, and low temperature coefficient of offset voltage and input current. Prior art attempts to design such an amplifier are shown in U.S. Patents No. 3,046,487 to Matzen et al. and No. 3,185,932 to Walker et al.

Accordingly, it is an object of this invention to provide such a direct coupled differential transistor amplifier with improved temperature coefficient of offset voltage.

Another object of the invention is to provide such a circuit employing a voltage reference point, the voltage of which changes linearly with temperature at a sufficiently high rate so that a resistor connected from this point to either or both collectors of one stage will not significantly load the collector circuit and will provide current imbalance sufficient to offset the differential temperature coefficient when passed to one of the collectors or divided between the two collector circuits in the proper ratio.

A further object of the invention is to provide such an amplifier in which the collector currents of the differential transistors in one stage are unbalanced in accordance with temperature to compensate for the differential offset voltage changes in the amplifier.

In carrying out this invention in one form thereof, a direct coupled differential transistor amplifier is provided, with varying potential means to provide a voltage point which varies linearly with temperature at a different rate than the voltage level of the collectors in one stage. A resistive network is provided between this voltage point and at least one of the two collectors for providing sufficient collector current imbalance proportional to temperature to compensate for any differential input offset voltage change with temperature changes.

The novel features which are believed to be characteristic of the invention are set forth with particularity in the appended claims. The invention and further objects and advantages thereof can best be understood by reference to the following description and accompanying drawing, which is a schematic diagram of an amplifier employing circuitry for one embodiment for providing the improved offset voltage temperature coefficient in accordance with the invention.

Turning now to the drawing, the amplifier illustrated therein is equipped not only for improved offset voltage temperature coefficient but also for high common mode rejection and low conversion of common mode signal to differential mode signal. These other features are discussed in a copending application, Ser. No. 496,878 of Barret B. Weekes and William E. Shoemaker entitled "Direct Coupled Differential Transistor Amplifier With Improved Common Mode Performance," filed concurrently herewith and assigned to the assignee of the present invention. The over-all operation of the amplifier will best be understood by referring to the two cases together. Discussion herein will be restricted to the features provided to accomplish low temperature coefficient of offset voltage and input current, low input current and low offset voltage.

The first stage of the amplifier is a differential input stage including transistors 104 and 106. It is desired to compensate these transistors for differences caused by temperature variations which result in changes in the base-emitter voltages $V_{be}$, of the devices. As described in the above referenced copending application, the diode chain, including diodes 148, 266, 268, 270 and 272 and resistor 149, is connected across the tap of potentiometer 132 in the collector circuit of the input stage and the emitter of transistor 260, which is always about 1.8 volts below the common mode input signal. Diodes 148 are germanium diodes and diodes 266, 268, 270 and 272 are silicon diodes. As is well known, the voltage drop across these diodes varies in a linear manner with changes in temperature.

The variable resistor 149, or input stage collector voltage adjustment means, is provided with an adjustment for varying its magnitude in order to make the voltage at collector 284 equal the voltage at collector 286, the collectors of transistors 104 and 106, respectively. This is done by compensating for the additive differential base-emitter voltage drops in transistors 136 and 144 vs. those in transistors 138 and 146.

The adjustment on potentiometer 132, the emitter current adjustment means, is provided in order to obtain equal emitter current in transistors 104 and 106 at a reference temperature, so that if it is desired to vary the differential mode gain by modifying the feedback path including resistors 124, 126, the currents in the two paths would be equal to avoid a referred to output offset voltage if the paths are interconnected. This is a first step in adjusting the circuit in one manner to obtain temperature correction. The variable resistor 114, or emitter circuit adjustment means, in the emitter circuit of transistor 106 is then adjusted so that the $V_{be}$ drop of transistor 104, plus the IR drop in resistor 108, is equal to the $V_{be}$ drop in transistor 106, plus the IR drop in resistors 112 and 114. These adjustments are made so that there is equal emitter currents and zero offset voltage at the reference temperature.

The potentiometer 290 is provided, connected to the diode chain at a voltage point such that the voltage at the wiper may be set equal to the voltage at the collectors 284 and 286 at the reference temperature. There is then no current through resistor 292, which is connected from the wiper of potentiometer 290 and through a wiper on potentiometer 294 and the two ends thereof to the collectors 284 and 286, so that the position of the wiper of potentiometer 294 is not important and does not influence the voltage or current in the collector circuit at this temperature. With the circuit balanced in this manner, even though the wiper of 294 is changed at another temperature, when it returns to this temperature the position of the wiper will have no effect on the balance of the circuit.

The temperature is then changed, by either raising or lowering it, to provide another reference point. An elevation of temperature will be described. As the temperature is raised, the collectors 284 and 286 go down at the rate of approximately 5 millivolts/° C. with respect to the point between diodes 148 and variable resistor 149, due to the base emitter voltage temperature coefficient of transistors 136, 138, 144 and 146. The wiper of 290, the point on the varying potential means consisting of the diode chain for providing temperature compensation, goes down at the rate of about 3 millivolts/° C. with respect to the point between diodes 148 and 149, due to the temperature coefficient of the diodes 266 and 268. The top of potentiometer 290 goes down at 3.6 millivolts/° C. with respect to the point between diodes 148 and 149 due to the temperature coefficients of the two silicon diodes 266 and 268. The bottom of potentiometer 290 goes down at 2.7 millivolts/° C. since the total impedance of potentiometer 290 is equal to that of resistor 291, which is in series with it across diode 268. The wiper of potentiometer 290 can then be set as mentioned, and will have a nominal rate of 3 millivolts/° C. with respect to the point between 148 and 149. As a result, the voltage at the wiper of 290 with respect to the voltage at the collectors 284 and 286, changes at a rate of approximately 2 millivolts/° C., the difference between the changes referred to above. For this reason, the current in resistor 292, which was zero at the first reference temperature, changes at the rate of 2 millivolts divided by the resistance of the two sections of the wiper 294 in parallel plus the resistance of resistor 292 per degree C. When the amplifier is temperature stabilized, the wiper of 294 is set so that the current in resistor 292, due to the temperature change, divides in a ratio so as to change the base emitter voltages of transistors 104 and 106 and their emitter circuit IR drops such that the offset voltage is again zero at the elevated temperature, that is, the $V_{be}$'s plus the IR drops in the emitter circuits of the two sides of the differential input stage and any other causes of input offset voltage must be equalized. Thus, resistor 292 and potentiometer 294 constitute an adjustable resistive network for injecting compensating collector currents. Since the current in resistor 292 varies linearly with temperature because the various diodes and $V_{be}$ drops are linear functions of temperature and, since the differential $V_{be}$ temperature coefficient of transistors 104 and 106 are also linear and we have compensated at two points on a straight line, the amplifier is now compensated at all temperatures along the linear temperature characteristics.

Differential mismatch in the following stages, such as transistors 136, 138 and 144, 146 due to both current amplification temperature coefficients and base-emitter voltage temperature coefficients, can also cause mismatch in the input stage $V_{be}$'s by way of their effects on the first stage collector currents. Compensation in the foregoing manner will also compensate for variations with temperature in these following stages.

The setting of the collector voltages and emitter currents by adjusting potentiometers 149 to equalize the collector voltages and 132 to set equal emitter currents and the adjustment of resistor 114 to correct for offset voltage, are not necessary for correcting for offset voltage temperature coefficients although it is convenient to carry out the adjustments in the order recited above. All that would be necessary would be to measure the offset at two different temperatures with no compensating current to either collector and compute the required change of current with respect to temperature which must be added to or taken from one of the collectors to compensate for the offset voltage temperature coefficient. Then a resistor of the required value could be added between the wiper of potentiometer 290 and the proper collectors. The value would be selected by dividing the change of voltage with respect to temperature at the wiper of potentiometer 290 by the desired change of current with respect to temperature. With the current divider 294 as illustrated, a larger total change of current with respect to temperature can be used so long as the difference to or from the two collectors equals the required amount.

The steps of setting variable resistor 149 to equalize collector voltage, the wiper on potentiometer 290 to set the voltage point at the wiper equal to the first stage collector voltages, potentiometer 132 to equalize emitter currents, variable resistor 114 to make the differential input offset voltage zero, all at one temperature, changing the temperature and setting potentiometer 294 to again make the differential input offset voltage zero, comprise the most convenient method, according to the invention, of adjusting for temperature compensation.

To better understand the operation of the amplifier illustrated in the drawing, it is also necessary to understand the correction made for offset current. The lead 296 is connected from the bottoms of potentiometers 298 and 300 to a point 10 germanium diodes up from the bottom of the diode chain 148 from the emitter of transistor 260, such that it has a temperature coefficient with respect to the common mode voltage of approximately —12 millivolts/° C. This is made up of the temperature coefficient of the 10 germanium diodes, or —20 millivolts/° C. minus the temperature coefficient of the three silicon base-emitter junctions in the transistors 104 or 106, and 258 and 260, which is —8 millivolts/° C. The tops of potentiometers 298 and 300 are connected to the point between diodes 268 and 270, which varies with respect to the lead 296 at the rate of about —22 millivolts/° C. due to the temperature coefficient of the silicon diodes 268, 266 and the 8 germanium diodes in the upper portion of the chair 148. As a result, the top of the parallel potentiometers 298 and 300 changes at —34 millivolts/° C. with respect to the common mode voltage at the bases of transistors 104 and 106.

The voltage at lead 296 is .7 volt above the common mode voltage at the bases of transistors 104 and 106. This is made up of .25 volt times 10 germanium diodes, minus 1.8 volts at the emitter of transistor 260. The voltage at the top of potentiometers 298 and 300 is 3.7 volts, which is made up of .25 volt times 8 germanium diodes plus .5 volt times 2 silicon diodes, plus .7 volt at lead 296. This voltage changes at the rate of —34 millivolts divided by 3.7 volts/° C., or at .92% per degree C. Lead 296 changes at —12 millivolts divided by .7 volt/° C., or 1.7% per degree C.

For the extremes, where the transistors 104 and 106 have high or low $\beta$, where $\beta$ is the current gain of the transistors, first where transistor 104 has a high $\beta$ of about 250, the base current would be about 10 microamps divided by $\beta$ or 250, or 40 nanoamperes. The wiper on 298 is then adjusted to supply 40 nanoamperes to the base of transistor 104 by setting it at .8 volts which, when divided by the resistance of resistors 302 (20 megs) gives 40 nanoamperes. The current which must be supplied at input terminal 100 is thereby reduced to zero. If the $\beta$ of transistor 104 changes at the rate of 1% per degree C., which is typical, this is a change of —.4 nanoampere/° C. in the base current. The current through resistor 302 changes approximately —1.7% per degree C. or —.68 nanoampere/° C., to give a change in the offset current required at the input terminal 100 of approximately +.28 nanoampere/° C., or the difference of the two.

At the other extreme where $\beta$ equals approximately 60, the base current of 104 equals 10 milliamperes divided by $\beta$ or 60, or 167 nanoamperes. If the wiper on potentiometer 298 is set at 3.33 volts to obtain 167 nanoamperes flowing in resistor 302 for a typical 1% $\beta$ change, the base current in transistor 104 changes −1.67 nanoamperes and the current in resistor 302 changes 167×−.92%, or −1.53 nanoamperes. The net input current change is then −.14 nanoameper/° C. At both extremes this difference is a small factor. A similar adjustment of pentiometer 300, injecting curernt through resistor 304, can be made in order to compensate the input current to transistor 106.

Since the principles of the invention have now been made clear, modifications which are particularly adapted for specific situations without departing from those principles will be apparent to those skilled in the art. The appended claims are intended to cover such modifications as well as the subject matter described and to only be limited by the true spirit of the invention.

What is claimed and desired to be secured by Letters Patent of the United States is:

1. A differential amplifier whose operation is substantially independent of ambient temperature variations comprising:

first and second transistors connected in a differential configuration, each of said transistors having base, emitter, and collector electrodes, load impedance means connected to said collector electrodes of said first and second transistors for deriving a differential output signal, the voltage at said collector electrodes varying at a first predetermined and linear rate as a function of temperature variations, a power supply for providing a bias voltage, a first bus for connecting one side of said power supply through said load impedance means to the collector electrodes of said first and second transistors, a second bus for connecting the other side of said power supply to the emitter electrodes of said first and second transistors, a voltage dividing network connected between said first and second buses and having a voltage point therein which varies at a second predetermined and linear rate as a function of temperature variations with respect to said voltage variations at said collector electrodes, and a resistive network connected between said voltage point in said voltage dividing network and said collector electrodes of said first and second transistors to provide a predetermined current flow proportional to temperature variations in said collector electrode paths of said first and second transistors to compensate for any differential offset voltage error in the amplifier.

2. A differential amplifier as defined in claim 1 wherein said voltage dividing network includes a plurality of diodes connected in a series.

3. The amplifier of claim 1 in which:

said resistive network comprises a resistor connected from said voltage point to the junction of two resistors with the other ends of said two resistors connected to the collector electrodes of each of said first and second transistors.

4. The amplifier of claim 3 in which said two resistors are the two ends of a potentiometer and said junction is the wiper.

5. The amplifier of claim 3 comprising in addition collector voltage adjustment means in said voltage dividing network for first setting the collector voltages of said first and second transistors equal prior to making adjustment for temperature compensation and circuit means for connecting said voltage adjustment means to said collector electrodes.

6. The amplifier of claim 5 in which said amplifier has at least one subsequent stage comprising a second pair of transistors connected in a differential configuration and said collector voltage adjustment means is connected through the emitter-base diode of each transistor in said at least one subsequent stage and through corresponding emitter-base diodes of corresponding sides of any intermediate stages to the collectors on corresponding sides of said one stage.

7. The amplifier of claim 6 comprising in addition emitter current adjustment means connected in the collector circuit of the first stage for obtaining equal emitter currents at a first reference temperature after equalizing the collector voltages in said one stage and prior to making adjustment for temperature compensation.

8. The amplifier of claim 7 comprising in addition base to emitter voltage circuit adjustment means connected in the emitter circuit of the first stage for adjusting the relative emitter impedances in said one stage to obtain zero differential input offset voltage at said first reference temperature after equalizing emitter currents and prior to making adjustment for temperature compensation.

References Cited

UNITED STATES PATENTS

| | | | |
|---|---|---|---|
| 3,077,566 | 2/1963 | Vosteen | 330—30 X |
| 3,182,269 | 5/1965 | Smith | 330—30 X |
| 3,346,817 | 10/1967 | Walker et al. | 330—23 |
| 3,370,245 | 2/1968 | Royce et al. | 330—30 |

JOHN KOMINSKI, Primary Examiner

L. J. DAHL, Assistant Examiner

U.S. Cl. X.R.

330—23